(12) United States Patent
Ohta et al.

(10) Patent No.: US 7,999,286 B2
(45) Date of Patent: Aug. 16, 2011

(54) MIS FIELD EFFECT TRANSISTOR AND METHOD FOR MANUFACTURING THE SAME

(75) Inventors: Hiroaki Ohta, Kyoto (JP); Hidemi Takasu, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 238 days.

(21) Appl. No.: 12/310,353

(22) PCT Filed: Aug. 22, 2007

(86) PCT No.: PCT/JP2007/066295
§ 371 (c)(1),
(2), (4) Date: Feb. 23, 2009

(87) PCT Pub. No.: WO2008/023739
PCT Pub. Date: Feb. 28, 2008

(65) Prior Publication Data
US 2009/0278197 A1    Nov. 12, 2009

(30) Foreign Application Priority Data

Aug. 24, 2006  (JP) ................................ 2006-228027

(51) Int. Cl.
*H01L 29/778* (2006.01)
(52) U.S. Cl. ................. 257/194; 257/108; 257/E29.252
(58) Field of Classification Search .................. 257/108, 257/136, 192, 194, 252, 469, E21.41, E21.64, 257/E21.643, E29.245, E29.246, E29.249, 257/E29.252, E29.253
See application file for complete search history.

(56) References Cited

U.S. PATENT DOCUMENTS

| 3,819,974 A | * | 6/1974 | Stevenson et al. ............ 313/499 |
| 4,568,958 A | | 2/1986 | Baliga |
| 7,211,839 B2 | | 5/2007 | Kachi et al. |
| 7,256,416 B2 | | 8/2007 | Kohda |

(Continued)

FOREIGN PATENT DOCUMENTS

JP        60227476        11/1985
(Continued)

OTHER PUBLICATIONS

JP-2005-203753, Jul. 28, 2005, Int Rectifier Corp, Intl Search Report.

(Continued)

*Primary Examiner* — Thomas L Dickey
(74) *Attorney, Agent, or Firm* — Rabin & Berdo, P.C.

(57) ABSTRACT

The MIS field-effect transistor includes: a substrate; a nitride semiconductor multilayer structure portion formed on the substrate, including a first group III-V nitride semiconductor layer of a first conductivity type, a second group III-V nitride semiconductor layer of a second conductivity type stacked thereon and a third group III-V nitride semiconductor layer of the first conductivity type stacked thereon; a gate insulating film formed on a wall surface formed over the first, second and third group III-V nitride semiconductor layers to extend over these first, second and third group III-V nitride semiconductor layers; a gate electrode made of a conductive material formed as being opposed to the second group III-V nitride semiconductor layer via the gate insulating film; a drawn portion electrically connected to the first group III-V nitride semiconductor layer and drawn from the nitride semiconductor multilayer structure portion in a direction parallel to the substrate; a drain electrode formed in contact with the drawn portion; and a source electrode electrically connected to the third group III-V nitride semiconductor layer.

17 Claims, 5 Drawing Sheets

U.S. PATENT DOCUMENTS

| | | | |
|---|---|---|---|
| 2003/0082860 A1 | 5/2003 | Yoshida et al. | |
| 2004/0061129 A1* | 4/2004 | Saxler et al. | 257/192 |
| 2005/0145883 A1* | 7/2005 | Beach et al. | 257/194 |
| 2005/0258450 A1* | 11/2005 | Saxler | 257/192 |
| 2006/0084245 A1 | 4/2006 | Kohda | |
| 2006/0108602 A1 | 5/2006 | Tanimoto | |

FOREIGN PATENT DOCUMENTS

| | | |
|---|---|---|
| JP | 2000-091253 | 3/2000 |
| JP | 2004-260140 | 9/2004 |
| JP | 2005-101538 | 4/2005 |
| JP | 2005-183733 | 7/2005 |
| JP | 2006-114829 | 4/2006 |

OTHER PUBLICATIONS

JP-2003-163354, Jun. 6, 2003, Furukawa Electric Co Ltd, Intl Search Report.

JP-2006-173582, Jun. 29, 2006, Nichia Kagaku Kogyo Kk, Intl Search Report.

Baker, T.J. et al., Characterization of Planar Semipolar Gallium Nitride Films on Sapphire Substrates, Jpn J Appl Phys Part 2, 2006, vol. 45, No. 4-7, pp. L154-L157. cited in Int'l Search Report.

Satoshi Okubo, "Not Only Shining Any Longer GaN Behind Evolution of Devices", Jun. 5, 2006, Nikkei Electronics, p. 51-60 which is described on p. 2 of the English Specification.

* cited by examiner

MIS FIELD EFFECT TRANSISTOR AND METHOD FOR MANUFACTURING THE SAME

TECHNICAL FIELD

The present invention relates to an MIS field-effect transistor employing group III-V nitride semiconductors and a method of manufacturing the same.

PRIOR ART

In general, a power device employing a silicon semiconductor is employed for a power amplifier circuit, a power supply circuit, a motor driving circuit or the like.

However, improvement in breakdown voltage, reduction in resistance and improvement in speed of a silicon device are now reaching the limits due to the theoretical limit of the silicon semiconductor, and it is becoming difficult to satisfy requirements of the market.

Therefore, development of a GaN device having characteristics such as a high breakdown voltage, a high-temperature operation, a high current density, high-speed switching and small on-resistance is examined (see following Non-Patent Document 1).

Patent Document 1: Japanese Unexamined Patent Publication No. 2004-260140
Patent Document 2: Japanese Unexamined Patent Publication No. 2000-91253
Non-Patent Document 1: Satoshi Okubo, "Not Only Shining Any Longer GaN Behind Evolution of Devices", Jun. 5, 2006, Nikkei Electronics, p. 51-60

DISCLOSURE OF THE INVENTION

Problems to be Solved

However, every one of heretofore proposed GaN devices has a lateral structure obtained by arranging a source, a gate and a drain along a substrate surface, is not necessarily suitable for a power device requiring a high current, and not sufficient in breakdown voltage either. Further, it is not necessarily easy to implement a normally-off operation which can be regarded as indispensable for a power device.

Accordingly, an object of the present invention is to provide a group III-V nitride semiconductor MIS field-effect transistor suitable for application to a power device and a method of manufacturing the same.

Solutions to the Problems

The MIS field-effect transistor according to the present invention is an MIS field-effect transistor including: a substrate (1); a nitride semiconductor multilayer structure portion (2) formed on the substrate, including a first group III-V nitride semiconductor layer (5, 55) of a first conductivity type, a second group III-V nitride semiconductor layer (6) of a second conductivity type stacked on this first group III-V nitride semiconductor layer and a third group III-V nitride semiconductor layer (7, 57) of the first conductivity type stacked on this second group III-V nitride semiconductor layer; a gate insulating film (19, 50) formed on a wall surface (17) formed over the first, second and third group III-V nitride semiconductor layers to extend over these first, second and third group III-V nitride semiconductor layers; a gate electrode (20) made of a conductive material formed as being opposed to the second group III-V nitride semiconductor layer (more preferably, a region extending over the first to third group III-V nitride semiconductor layers) with the gate insulating film interposed therebetween; a drawn portion (10, 11, 59) electrically connected to the first group III-V nitride semiconductor layer and drawn from the nitride semiconductor multilayer structure portion in a direction parallel to the substrate; a drain electrode (15) formed in contact with this drawn portion; and a source electrode (25) electrically connected to the third group III-V nitride semiconductor layer.

While the alphanumeric characters in the parentheses denote corresponding components etc. in embodiments described later, it is not intended that the scope of the present invention is to be interpreted limitedly to the embodiments. This also applies in this section.

According to this structure, the nitride semiconductor multilayer structure portion of an NPN structure or a PNP structure is formed by stacking the first group III-V nitride semiconductor layer, the second group III-V nitride semiconductor layer and the third group III-V nitride semiconductor layer. The gate insulating film is arranged on the wall surface formed over the first to third group III-V nitride semiconductor layers. A portion of the second group III-V nitride semiconductor layer forming the wall surface forms a channel region through this gate insulating film, and the gate electrode is opposed to this channel region. Further, the drain electrode is provided to be electrically connected to the first group III-V nitride semiconductor layer, and the source electrode is provided to be electrically connected to the third group III-V nitride semiconductor layer. Thus, a vertical MIS (Metal Insulator Semiconductor) field-effect transistor is comprised.

Thus, a normally-off operation, i.e., an operation for setting an OFF-state between the source and the drain when applying no bias to the gate electrode can be easily implemented due to the basic structure as a vertical MIS field-effect transistor. Further, a high current can be easily fed due to the vertical structure, while a high breakdown voltage can be so ensured that an effective power device can be provided. Needless to say, the field-effect transistor is constituted of the group III-V nitride semiconductor layers, whereby the same can attain characteristics such as a high break down voltage, a high-temperature operation, a high current density, high-speed switching and small on-resistance as compared with a device employing a silicon semiconductor. In particular, the MIS field-effect transistor is capable of an operation with a high breakdown voltage and low loss, whereby an excellent power device can be implemented.

Moreover, the drain electrode is brought into contact with the drawn portion drawn in the lateral direction of the nitride semiconductor multilayer structure portion, whereby the MIS field-effect transistor of the vertical structure can be implemented even when the substrate is an insulating substrate.

As the substrate capable of growing the nitride semiconductor layers, an $Al_2O_3$ substrate (sapphire substrate), a ZnO substrate, an Si substrate, a GaAs substrate, a GaN substrate or an SiC substrate is applicable. Among these, the $Al_2O_3$ substrate has such a merit that the same can be obtained at a low cost, although the same is insulative. According to the structure of the present invention allowing application of an insulating substrate, therefore, the manufacturing cost can be reduced. Needless to say, another substrate can be employed, the GaN substrate is the best in view of the matching property of the lattice constant with the nitride semiconductor multilayer structure portion, and nitride semiconductor layers having small numbers of dislocations can be formed by employing the GaN substrate. In a case of attaching importance to a heat radiation property (heat conductivity), the SiC substrate may be employed.

The group III-V nitride semiconductors are semiconductors employing nitrogen as a group V element in group III-V semiconductors, and aluminum nitride (AlN), gallium nitride (GaN) and indium nitride (InN) are typical examples. The same can be generally expressed as $Al_xIn_yGa_{1-x-y}N$ ($0 \leq x \leq 1$, $0 \leq y \leq 1$ and $0 \leq x+y \leq 1$).

An operation in a case of constituting an N-channel MIS field-effect transistor by setting the first group III-V nitride semiconductor layer and the third group III-V nitride semiconductor layer to N-types and setting the second group III-V nitride semiconductor layer to a P-type, for example, is described. In this case, a bias positive on the drain side is supplied between the source and the drain. At this time, it follows that a reverse voltage is applied to the P—N junction portion on the interface between the first and second group III-V nitride semiconductor layers, and hence the source and the drain are cut off. When applying a bias voltage positive with respect to the second group III-V nitride semiconductor layer to the gate electrode from this state, electrons are induced in a region (channel region) around the wall surface opposed to the gate electrode in the second group III-V nitride semiconductor layer, and an inversion channel is formed. The first and third group III-V nitride semiconductor layers conduct through this inversion channel, and hence it follows that the source and the drain conduct. Thus, the source and the drain conduct when supplying a proper bias to the gate electrode, while the source and the drain are cut off when supplying no bias to the gate electrode. In other words, the normally-off operation is implemented. In a case of constituting a P-channel field-effect transistor by setting the first and third group III-V nitride semiconductor layers to P-types and setting the second group III-V nitride semiconductor layer to an N-type, the operation is similar to the above while the polarity of the bias voltage is reversed.

The nitride semiconductor multilayer structure portion may have a fourth group III-V nitride semiconductor layer (9) of the first conductivity type between the substrate and the first group III-V nitride semiconductor layer, and the drawn portion may be an extension (10) of the fourth group III-V nitride semiconductor layer. Preferably, the fourth group III-V nitride semiconductor layer is provided in contact with the first group III-V nitride semiconductor layer.

According to this structure, the drain electrode is connected to the fourth group III-V nitride semiconductor layer formed in contact with the first group III-V nitride semiconductor layer, whereby the drain electrode can be electrically connected to the first group III-V nitride semiconductor layer through this fourth group III-V nitride semiconductor layer. Even if the nitride semiconductor multilayer structure portion is provided on an insulating substrate, the electrical connection between the drain electrode and the first group III-V nitride semiconductor layer can be attained through the fourth group III-V nitride semiconductor layer.

The fourth group III-V nitride semiconductor layer may be a group III-V nitride semiconductor layer containing Al. The fourth group III-V nitride semiconductor layer containing Al contributes to improvement of the breakdown voltage and reduction in resistance.

The nitride semiconductor multilayer structure portion may further include a fifth group III-V nitride semiconductor layer (8) which is an intrinsic semiconductor layer (undoped) formed between the substrate and the fourth group III-V nitride semiconductor layer.

According to this structure, the fourth group III-V nitride semiconductor layer and the fifth group III-V nitride semiconductor layer consisting of the intrinsic semiconductor layer are arranged in a stacking relation. In the vicinity of the boundary between these fourth and fifth group III-V nitride semiconductor layers, two-dimensional electron gas (28) of a high concentration is formed in the fifth group III-V nitride semiconductor layer. The resistance of a portion reaching the drain electrode from the first group III-V nitride semiconductor layer can be reduced and further reduction in resistance can be attained by utilizing this two-dimensional electron gas. In particular, a current flowing between the first group III-V nitride semiconductor layer and the two-dimensional electron gas can be dispersed in a wide range of the first group III-V nitride semiconductor layer, despite the structure of drawing the drain in the lateral direction of the nitride semiconductor multilayer structure portion through the fourth group III-V nitride semiconductor layer. Thus, concentration of the current can be suppressed, and reduction in resistance of the device is implemented.

The fifth group III-V nitride semiconductor layer may be a layer doped with Mg, C or Fe. A nitride semiconductor tends to be somewhat N-typed in formation (epitaxial growth) thereof, and hence the fifth group III-V nitride semiconductor layer can be rendered intrinsic by doping the same with Mg, C or Fe as a P-type dopant, in order to cancel this.

The drawn portion may be an extension (11, 59) of the first group III-V nitride semiconductor layer. Also according to this structure, the vertical MIS field-effect transistor can be formed on the substrate, and the drain electrode can be taken on the substrate. Therefore, the vertical MIS field-effect transistor can be formed also on an insulating substrate.

The substrate may be an insulating substrate. As hereinabove described, the vertical MIS field-effect transistor can be constituted according to the structure of the present invention, also by employing the insulating substrate.

A trench (16) reaching the first group III-V nitride semiconductor layer may be formed from the third group III-V nitride semiconductor layer through the second group III-V nitride semiconductor layer, and the sidewall of this trench may form the wall surface. According to this structure, the wall surface of the second group III-V nitride semiconductor layer providing a channel region can be exposed by forming the trench on the nitride semiconductor multilayer structure portion.

The trench may be a sectionally V-shaped trench, may be a sectionally U-shaped trench, or may be a sectionally rectangular trench. Further, the trench may be a V-shaped trench (inverted trapezoidal groove) having a planar surface on a bottom portion, or may be a trench having a trapezoidal sectional shape.

Preferably, the source electrode is provided to be in contact with both of the second group III-V nitride semiconductor layer and the third group III-V nitride semiconductor layer.

According to this structure, the source electrode is in contact with both of the second and third group III-V nitride semiconductor layers, whereby connection of the source electrode to the third group III-V nitride semiconductor layer is ensured, while the second group III-V nitride semiconductor layer can be fixed to the same potential as the source at the same time. Therefore, the inversion channel can be formed on the portion (channel region) of the second group III-V nitride semiconductor layer opposed to the wall surface by supplying the bias to the gate electrode with respect to the source potential.

For example, a trench (24) for embedding the source electrode may be formed on a position different from the wall surface of the nitride semiconductor multilayer structure portion, so that the source electrode is embedded in this trench. In this case, the trench for the source electrode may be formed in a depth reaching the second group III-V nitride semiconductor layer from the third group III-V nitride semiconductor layer.

The first, second and third group III-V nitride semiconductor layers may be stacked with major surfaces defined by C-planes (0001).

The first, second and third group III-V nitride semiconductor layers may be stacked with major surfaces defined by nonpolar planes (m-planes (10-10) or a-planes (11-20)) or semipolar planes ((10-1-1), (10-1-3), (11-22) or the like).

Preferably, the wall surface of the first, second and third group III-V nitride semiconductor layers on which the gate insulating film is formed is defined by a nonpolar plane (an m-plane (10-10) or an a-plane (11-20)) or a semipolar plane ((10-1-1), (10-1-3), (11-22) or the like).

The substrate may be a substrate having a region exhibiting a high dislocation density and a region exhibiting a small dislocation density in a direction along the substrate surface. In this case, the gate electrode is preferably arranged to be opposed to a region grown from the region exhibiting a low dislocation density.

In a substrate having an epitaxially grown layer formed by epitaxial lateral overgrowth (ELO) described in Patent Document 2, for example, a region (dislocation-free region) exhibiting a low dislocation density and a region exhibiting a high dislocation density are present in the epitaxially grown layer. When the channel region (the region opposed to the wall surface) of the second group III-V nitride semiconductor layer is located on a region grown from the region exhibiting a low dislocation density in this case, the dislocation density of the channel region so lowers that a leakage current can be suppressed.

The gate insulating film may be a nitride or an oxide. In particular, the gate insulating film is preferably made of silicon nitride or silicon oxide.

Preferably, the conductive material constituting the gate electrode is made of a simple metal or an alloy containing at least any one of Al, Au and Pt. Further, the conductive material constituting the gate electrode may contain polysilicon.

On the other hand, the source electrode or the drain electrode is preferably made of a material containing at least Al. More specifically, the source electrode or the drain electrode is preferably made of an alloy material containing at least Ti and Al. Thus, contact for wiring can be excellently attained with respect to the source electrode or the drain electrode. The material constituting the source electrode or the drain electrode may contain Mo or an Mo compound, Ti or a Ti compound, or W or a W compound.

A method of manufacturing an MIS field-effect transistor according to the present invention includes: a step of forming a nitride semiconductor multilayer structure portion (2) on a substrate (1) by stacking a plurality of group III-V nitride semiconductor layers including a first group III-V nitride semiconductor layer (5, 55) of a first conductivity type, a second group III-V nitride semiconductor layer (6) of a second conductivity type stacked on this first group III-V nitride semiconductor layer and a third group III-V nitride semiconductor layer (7, 57) of the first conductivity type stacked on this second group III-V nitride semiconductor layer; a wall surface forming step of forming a wall surface (17) extending over the first, second and third group III-V nitride semiconductor layers; a step of shaping the nitride semiconductor multilayer structure portion by etching at least the second and third group III-V nitride semiconductor layers of the nitride semiconductor multilayer structure portion while forming a drawn portion (10) drawn from this shaped nitride semiconductor multilayer structure portion in a direction parallel to the substrate on a group III-V nitride semiconductor layer (9, 5) of the first conductivity type arranged between the second group III-V nitride semiconductor layer and the substrate; a gate insulating film forming step of forming a gate insulating film (19) on the wall surface to extend over the first, second and third group III-V nitride semiconductor layers; a step of forming a gate electrode (20) made of a conductive material to be opposed to the second group III-V nitride semiconductor layer with the gate insulating film interposed therebetween; a step of forming a drain electrode (15) to be in contact with the drawn portion; and a step of forming a source electrode (25) to be electrically connected to the third group III-V nitride semiconductor layer.

The nitride semiconductor multilayer structure portion may have a fourth group III-V nitride semiconductor layer (9) of the first conductivity type between the substrate and the first group III-V nitride semiconductor layer, and the drawn portion may be an extension of the fourth group III-V nitride semiconductor layer.

The fourth group III-V nitride semiconductor layer may be a group III-V nitride semiconductor layer containing Al.

The nitride semiconductor multilayer structure portion may further include a fifth group III-V nitride semiconductor layer (8) which is an intrinsic semiconductor layer formed between the substrate and the fourth group III-V nitride semiconductor layer.

The drawn portion may be an extension of the first group III-V nitride semiconductor layer.

The substrate may be an insulating substrate.

The wall surface forming step may include a trench forming step of forming a trench (16) reaching the first group III-V nitride semiconductor layer from the third group III-V nitride semiconductor layer through the second group III-V nitride semiconductor layer, and the sidewall of this trench may define the wall surface.

Preferably, the trench forming step includes a dry etching step and a wet etching step removing a damaged layer resulting from this dry etching step. Preferably, the wet etching step includes a wet etching step employing an alkaline solution as an etching liquid. As the alkaline solution, KOH (potassium hydroxide), $NH_4OH$ (ammonia water) or the like can be employed.

The first group III-V nitride semiconductor layer may have a larger band gap than the second group III-V nitride semiconductor layer. According to this structure, the breakdown voltage can be further improved due to the large band gap of the first group III-V nitride semiconductor layer. More specifically, the first group III-V nitride semiconductor layer preferably contains Al. Further specifically, the first group III-V nitride semiconductor layer preferably contains not less than 5% by weight of Al.

Similarly, the third group III-V nitride semiconductor layer may have a larger band gap than the second group III-V nitride semiconductor layer. According to this structure, the breakdown voltage can be improved due to the large band gap of the third group III-V nitride semiconductor layer. More specifically, the third group III-V nitride semiconductor layer preferably contains Al. Further specifically, the third group III-V nitride semiconductor layer preferably contains not less than 5% by weight of Al.

In particular, the breakdown voltage can be more effectively improved by rendering the band gaps of both of the first and third group III-V nitride semiconductor layers larger than the band gap of the second group III-V nitride semiconductor layer and forming a double heterojunction.

The gate insulating film may be brought into a structure having a group III-V nitride intrinsic semiconductor gate layer (51: preferably containing no In) containing Al. This group III-V nitride intrinsic semiconductor gate layer forms an excellent interface between the same and the wall surface of the first to third group III-V nitride semiconductor layers. Therefore, such an inconvenience that the carrier mobility in the channel region lowers or reliability of the device lowers due to an unstable interface can be suppressed or avoided, dissimilarly to a case of forming an insulating film such as an oxide film in contact with the wall surface of the first to third group III-V nitride semiconductor layers. The group III-V nitride intrinsic semiconductor layer containing Al can be formed by regrowth from the wall surface.

Preferably, the gate insulating film further includes another insulating film (52) stacked on the group III-V nitride intrinsic semiconductor gate layer containing Al. In this case, the other insulating film is preferably stacked oppositely to the wall surface with respect to the group III-V nitride intrinsic semiconductor gate layer. A gate leakage current can be reduced due to this structure. The group III-V nitride intrinsic semiconductor gate layer containing Al may be insufficient in insulating property when the Al composition is small. In this case, the other insulating film preferably compensates for the insufficient insulating property of the group III-V nitride intrinsic semiconductor gate layer containing Al. Preferably, the Al composition in the group III-V nitride intrinsic semiconductor gate layer containing Al is 50 to 100% by weight (not less than 50% by weight and less than 100% by weight). Thus, a necessary insulating property can be ensured.

BRIEF DESCRIPTION OF THE DRAWINGS

FIG. 2 FIGS. 2A to 2E are schematic sectional views showing a method of manufacturing the MIS field-effect transistor of FIG. 1 in step order.

DESCRIPTION OF THE REFERENCE NUMERALS

1 . . . sapphire substrate, 2 . . . nitride semiconductor multilayer structure portion, 5 . . . N-type GaN layer, 6 . . . P-type GaN layer, 7 . . . N-type GaN layer, 8 . . . intrinsic GaN layer, 9 . . . N-type AlGaN layer, 10 . . . drawn portion, 11 . . . drawn portion, 15 . . . drain electrode, 16 . . . trench, 17 . . . wall surface, 19 . . . gate insulating film, 20 . . . gate electrode, 21 . . . channel region, 24 . . . source electrode trench, 25 . . . source electrode, 28 . . . two-dimensional electron gas, 30 . . . groove, 50 . . . gate insulating film, 51 . . . AlGaN regrowth layer, 52 . . . insulating film, 55 . . . N-type AlGaN layer, 57 . . . N-type AlGaN layer, 59 . . . drawn portion.

BEST MODE FOR CARRYING OUT THE INVENTION

Figure 1:
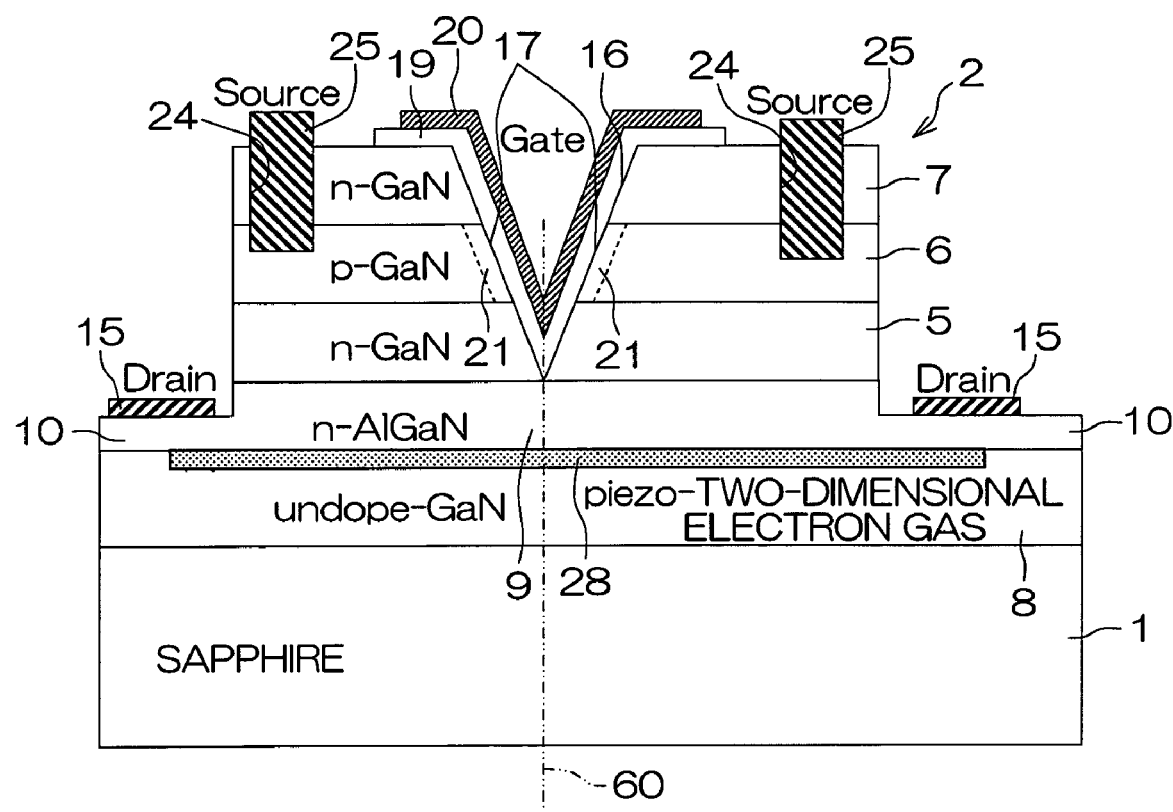
FIG. 1 A schematic sectional view for illustrating the structure of an MIS field-effect transistor according to a first embodiment of the present invention.

FIG. 1 is a schematic sectional view for illustrating the structure of an MIS field-effect transistor according to a first embodiment of the present invention. This field-effect transistor includes a sapphire substrate 1 which is an insulating substrate and a nitride semiconductor multilayer structure portion 2 consisting of GaN compound semiconductor layers grown on this sapphire substrate 1. The nitride semiconductor multilayer structure portion 2 includes an N-type GaN layer 5 (drain layer), a P-type GaN layer 6 stacked on this N-type GaN layer 5 and an N-type GaN layer 7 (source layer) stacked on this P-type GaN layer 6. Further, the nitride semiconductor multilayer structure portion 2 includes an intrinsic (undoped) GaN layer 8 formed in contact with the sapphire substrate 1 and an N-type AlGaN layer 9 stacked on this intrinsic GaN layer 8, and the N-type GaN layer 5 is stacked on this N-type AlGaN layer 9.

The nitride semiconductor multilayer structure portion 2 is etched up to such a depth that the N-type AlGaN layer 9 is exposed from the N-type GaN layer 7 so that the section is generally rectangular. The N-type AlGaN layer 9 has drawn portions 10 drawn from both sides of the nitride semiconductor multilayer structure portion 2 in a lateral direction along the surface of the sapphire substrate 1. Drain electrodes 15 are formed in contact with the surfaces of these drawn portions 10. In other words, the drawn portions 10 laterally drawn from the nitride semiconductor multilayer structure portion 2 are constituted of extensions of the N-type AlGaN layer 9 in this embodiment.

On the other hand, a trench 16 having a depth reaching an intermediate portion of the N-type GaN layer 5 from the N-type GaN layer 7 through the P-type GaN layer 6 is formed in the vicinity of a width-directional intermediate portion of the nitride semiconductor multilayer structure portion 2. According to this embodiment, the trench 16 is formed in a sectionally V-shaped manner, and inclined side surfaces thereof form wall surfaces 17 extending over the N-type GaN layer 5, the P-type GaN layer 6 and the N-type GaN layer 7. A gate insulating film 19 is formed on a region covering the overall regions of these wall surfaces 17 and reaching edge portions of the trench 16 on an upper surface of the N-type GaN layer 7. Further, agate electrode 20 is formed on this gate insulating film 19. In other words, the gate electrode 20 is opposed to the wall surfaces 17, i.e., the N-type GaN layer 5, the P-type GaN layer 6 and the N-type GaN layer 7 with the gate insulating film 19 interposed therebetween, and further formed to extend up to portions around the edge portions of the trench 16 on the upper surface of the N-type GaN layer 7.

Regions around the wall surfaces 17 in the P-type GaN layer 6 are channel regions 21 opposed to the gate electrode 20. A proper bias voltage is so applied to the gate electrode 20 that inversion channels electrically conducting the N-type GaN layers 5 and 7 are formed in these channel regions 21.

In the nitride semiconductor multilayer structure portion 2, source electrode trenches 24 are formed on positions different from the trench 16. According to this embodiment, a pair of source electrode trenches 24 are formed on both sides of the trench 16. The source electrode trenches 24 are formed up to a depth reaching the P-type GaN layer 6 from the surface of the N-type GaN layer 7. Source electrodes 25 are embedded in these source electrode trenches 24. Therefore, it follows that the source electrodes 25 are electrically connected to both of the N-type GaN layer 7 and the P-type GaN layer 6.

Two-dimensional electron gas 28 is generated in the intrinsic GaN layer 8 in the vicinity of the interface between the intrinsic GaN layer 8 and the N-type AlGaN layer 9, due to a piezoelectric effect.

The intrinsic GaN layer 8 is formed on the sapphire substrate 1 by the so-called epitaxial lateral overgrowth (ELO), and has a region exhibiting a high dislocation density and regions (dislocation-free regions) exhibiting small dislocation densities in the horizontal direction along the substrate surface. The position for forming the trench 16 is so selected that the regions (dislocation-free regions) exhibiting small dislocation densities are positioned immediately under the channel regions 21. The intrinsic GaN layer 8 is so grown on the sapphire substrate 1 that the major surface (surface parallel to the sapphire substrate 1) thereof is defined by a C-plane (0001), for example. In this case, it follows that the N-type AlGaN layer 9, the N-type GaN layer 5, the P-type GaN layer 6 and the N-type GaN layer 7 stacked on the intrinsic GaN layer 8 by epitaxial growth are stacked also with major surfaces defined by C-planes (0001). The wall surfaces of the sectionally V-shaped trench 16 are defined by nonpolar planes (m-planes (10-10) or a-planes (11-20)), or semipolar planes ((10-1-1), (10-1-3), (11-22) or the like), for example.

The intrinsic GaN layer 8 may be so grown on the sapphire substrate 1 that the major surface thereof is defined by a nonpolar plane (an m-plane (10-10) or an a-plane (11-20)) or a semipolar plane ((10-1-1), (10-1-3), (11-22) or the like). In this case, it follows that the N-type AlGaN layer 9, the N-type GaN layer 5, the P-type GaN layer 6 and the N-type GaN layer 7 are stacked with major surfaces defined by the corresponding crystal planes, accordingly.

The gate insulating film 19 can be constituted of a nitride or an oxide, for example. More specifically, the quantity of charge on the interface between the gate insulating film 19 and the P-type GaN layer 6 can be reduced and carrier mobility in the channel regions 21 can be improved when constituting the gate insulating film of silicon nitride ($Si_xN_y$) or silicon oxide. In other words, channel resistance can be reduced.

The gate electrode 20 is constituted of a conductive material such as an Ni—Au alloy, an Ni—Ti—Au alloy, a Pd—Au alloy, a Pd—Ti—Au alloy, a Pd—Pt—Au alloy, Pt, Al or polysilicon.

The drain electrodes 15 are preferably constituted of a metal containing at least Al, and can be constituted of a Ti—Al alloy, for example. Similarly, the source electrodes 25 are also preferably constituted of a metal containing Al, and can be constituted of a Ti—Al alloy, for example. The drain electrodes 15 and the source electrodes 25 are so constituted of the metal containing Al that excellent contact with a wiring layer (not shown) can be attained. Alternatively, the drain electrodes 15 and the source electrodes 25 may be constituted of Mo or an Mo compound (molybdenum silicide, for example), Ti or a Ti compound (titanium silicide, for example), or W or a W compound (tungsten silicide, for example).

The operation of the aforementioned MIS field-effect transistor is now described.

A bias voltage positive on the side of the drain electrodes 15 is supplied between the source electrodes 25 and the drain electrodes 15. Thus, a reverse voltage is supplied to the P—N junction on the interface between the N-type GaN layer 5 and the P-type GaN layer 6, and the N-type GaN layers 5 and 7, i.e., the source and the drain are cut off as a result. When a prescribed voltage positive on the side of the gate electrode 20 is supplied between the source electrodes 25 and the gate electrode 20 in this state, a bias with respect to the P-type GaN layer 6 is supplied to the gate electrode 20. Thus, electrons are induced in the channel regions 21 of the P-type GaN layer 6, and inversion channels are formed. The N-type GaN layers 5 and 7 conduct through these inversion channels. Thus, it follows that the source and the drain conduct. In other words, the source and the drain conduct when a prescribed bias is supplied to the gate electrode 20, while the source and the drain are cut off when no bias is supplied to the gate electrode 20. Thus, the normally-off operation is enabled.

When the inversion channels are formed in the channel regions 21, electrons supplied from the source electrodes 25 flow into the N-type GaN layer 5 from the N-type GaN layer 7 through the channel regions 21, and head toward the drain electrodes 15 via the two-dimensional electron gas 28. The two-dimensional electron gas 28 is widely distributed on the interface between the intrinsic GaN layer 8 and the N-type AlGaN layer 9, whereby the electrons flowing into the N-type GaN layer 5 from the channel regions 21 flow into the two-dimensional electron gas 28 through a wide range of the N-type GaN layer 5. Thus, concentration of a current can be relaxed and on-resistance can be suppressed, despite the structure of extracting the drain electrodes 15 in the lateral direction of the nitride semiconductor multilayer structure portion 2.

FIGS. 2A to 2E are schematic sectional views showing a method of manufacturing the MIS field-effect transistor of FIG. 1 in step order.

First, the intrinsic GaN layer 8 is formed on the sapphire substrate 1 by epitaxial lateral overgrowth (refer to Patent Document 2). Then, the N-type AlGaN layer 9, the N-type GaN layer 5, the P-type GaN layer 6 and the N-type GaN layer 7 are successively grown on this intrinsic GaN layer 8 by epitaxial growth. Thus, the nitride semiconductor multilayer structure portion 2 is formed on the sapphire substrate 1 (see FIG. 2A).

Regarding the substance obtained by forming the intrinsic GaN layer 8 on the sapphire substrate 1 by epitaxial lateral overgrowth as the "substrate", it may be conceived that the "nitride semiconductor multilayer structure portion" is constituted of the group III-V nitride semiconductor layers stacked above this intrinsic GaN layer 8. Alternatively, a substance obtained by previously forming a GaN layer on a sapphire substrate (bare substrate) by epitaxial lateral overgrowth may be employed as the sapphire substrate 1, for forming the intrinsic GaN layer 8 on this sapphire substrate 1 by ordinary epitaxial growth. Also in this case, the intrinsic GaN layer 8 inherits dislocations from the underlayer thereof, to have the region exhibiting a high dislocation density and the regions (dislocation-free regions) exhibiting low dislocation densities.

When forming the intrinsic GaN layer 8, the intrinsic GaN layer 8 may be intentionally doped with no impurity, or the epitaxial growth may be performed while doping the intrinsic GaN layer 8 with Mg, C or Fe as a P-type dopant. The GaN layer is somewhat N-type when epitaxially grown with no addition of a P-type dopant, and hence the P-type dopant is introduced in order to correct this. Mg, C or Fe may be employed also as a P-type dopant added when epitaxially growing the P-type GaN layer 6.

Si, for example, may be employed as an N-type dopant when epitaxially growing the N-type AlGaN layer 9 and the N-type GaN layers 5 and 7.

Figure 2A:
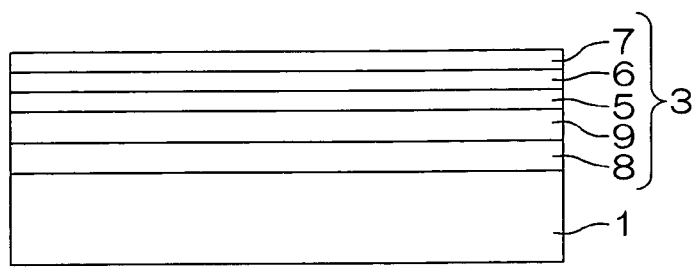
Figure 2B:
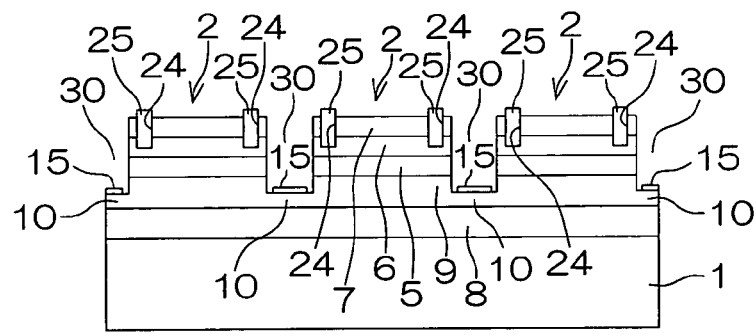

After the nitride semiconductor multilayer structure portion 2 is formed, the nitride semiconductor multilayer structure portion 2 is etched in a striped manner, as shown in FIG. 2B. In other words, sectionally rectangular grooves 30 reaching a layer-thickness intermediate portion of the N-type AlGaN layer 9 from the N-type GaN layer 7 through the P-type GaN layer 6 and the N-type GaN layer 5 are formed by etching. Thus, a plurality of nitride semiconductor multilayer structure portions 2 are shaped in a striped manner on the sapphire substrate 1, while the drawn portions 10 consisting of the extensions of the N-type GaN layer 9 are formed at the same time. Then, a pair of source electrode trenches 24 are formed along both side edges of each shaped nitride semiconductor multilayer structure portion 2 respectively. These source electrode trenches 24 are sectionally rectangular groove portions reaching the P-type GaN layer 6 from the N-type GaN layer 7, as hereinabove described.

The source electrode trenches 24 can be formed by dry etching (anisotropic etching) employing plasma, for example. Further, a wet etching treatment for improving trench inner wall surfaces damaged by the dry etching may be thereafter performed, if necessary. Thus, contact resistance of the source electrodes 25 can be reduced. An alkaline solution such as KOH (potassium hydroxide) or NH$_4$OH (ammonia water) is preferably employed for the wet etching.

After the source electrode trenches 24 are formed in this manner, the drain electrodes 15 and the source electrodes 25 are formed respectively, thereby providing the state of FIG. 2B. The drain electrodes 15 are formed to be in contact with the bottom surfaces of the grooves 30, i.e., the surfaces of the drawn portions 10 (extensions of the N-type AlGaN layer 9).

Figure 2C:
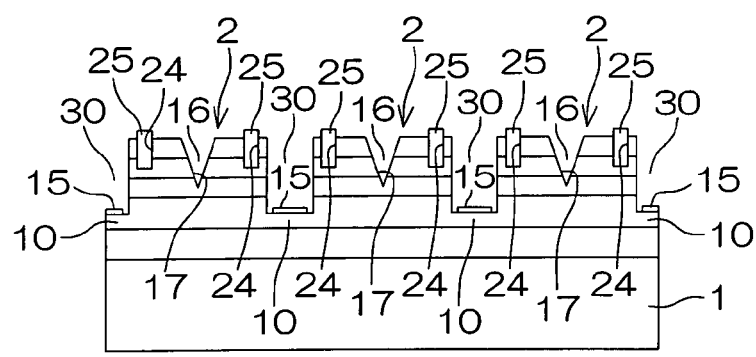

Then, the sectionally V-shaped trench 16 is formed in the vicinity of the width-directional intermediate portion of each nitride semiconductor multilayer structure portion 2 along the longitudinal direction of the nitride semiconductor multilayer structure portion 2, as shown in FIG. 2C. The position for forming the trench 16 is so set that the dislocation-free regions of the P-type GaN layer 6 are exposed from the sidewalls thereof to form the wall surfaces 17. This formation of the trench 16 includes a step of forming the V-shaped trench 16 reaching the N-type GaN layer 5 from the N-type GaN layer 7 through the P-type GaN layer 6 by dry etching (anisotropic etching) employing plasma and a wet etching step for improving the exposed surfaces damaged by the dry etching. In other words, the wet etching treatment is performed on the wall surfaces 17 damaged by the dry etching, whereby it follows that there appear new wall surfaces 17 from which damaged surface layers have been removed.

An alkaline solution such as KOH (potassium hydroxide) or NH$_4$OH (ammonia water) is preferably employed for the wet etching. Thus, less damaged wall surfaces 17 can be obtained. The damages of the wall surfaces 17 are so reduced that the crystal states of the channel regions 21 can be excellently kept and the interfaces between the wall surfaces 17 and the gate insulating film 19 can be rendered excellent, whereby the interfacial levels can be reduced. Thus, the channel resistance can be reduced, and a leakage current can be suppressed.

Figure 2D:
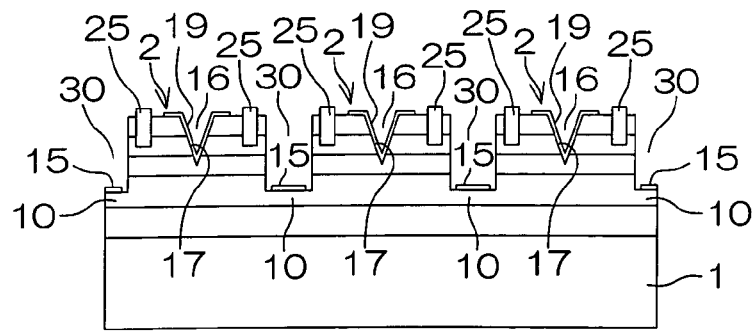

Then, the gate insulating film 19 covering the wall surfaces 17 of the V-shaped trench 16 and covering the edge portions of the trench 16 are formed, as shown in FIG. 2D. ECR (Electron Cyclotron Resonance) sputtering is preferably applied to the formation of the gate insulating film 19.

Figure 2E:
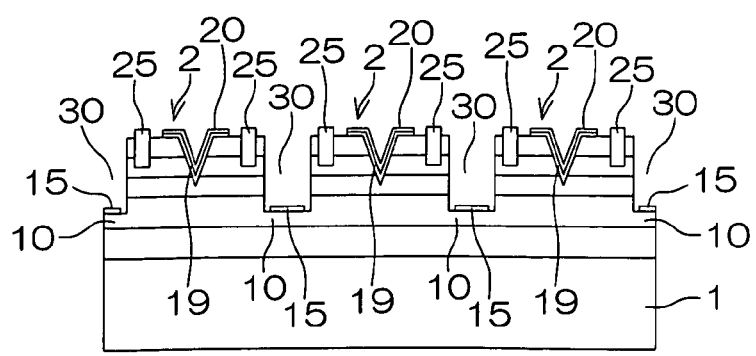

Thereafter the gate electrodes 20 are formed as shown in FIG. 2E, whereby the MIS field-effect transistor of the structure shown in FIG. 1 can be obtained.

The plurality of nitride semiconductor multilayer structure portions 2 formed on the sapphire substrate 1 in stripes form unit cells respectively. The drain electrodes 15, the gate electrodes 20 and the source electrodes 25 of the plurality of nitride semiconductor multilayer structure portions 2 are commonly connected on unshown positions respectively. The drain electrodes 15 can be shared between adjacent nitride semiconductor multilayer structure portions 2.

According to this embodiment, as hereinabove described, the vertical transistor structure obtained by stacking the N-type GaN layer 5, the P-type GaN layer 6 and the N-type GaN layer 7 is so employed that a field-effect transistor capable of a normally-off operation, capable of feeding a high current and having a high breakdown voltage can be implemented. Further, the intrinsic GaN layer 8 and the N-type AlGaN layer 9 are stacked on the sapphire substrate 1 and the drain electrodes 15 are formed in contact with the drawn portions 10 of the N-type AlGaN layer 9, whereby the electrons flowing into the N-type GaN layer 5 flow into the two-dimensional electron gas 28 through the wide range of this N-type GaN layer 5, and move toward the drain electrodes 15 provided on the side portions of the nitride semiconductor multilayer structure portion 2. Thus, concentration of a high current can be relaxed while employing the structure laterally extracting the drain electrodes 15, and hence the on-resistance can be effectively reduced. Moreover, a vertical field-effect transistor can be constituted and concentration of the current can be relaxed while employing the insulating sapphire substrate 1.

Figure 3:
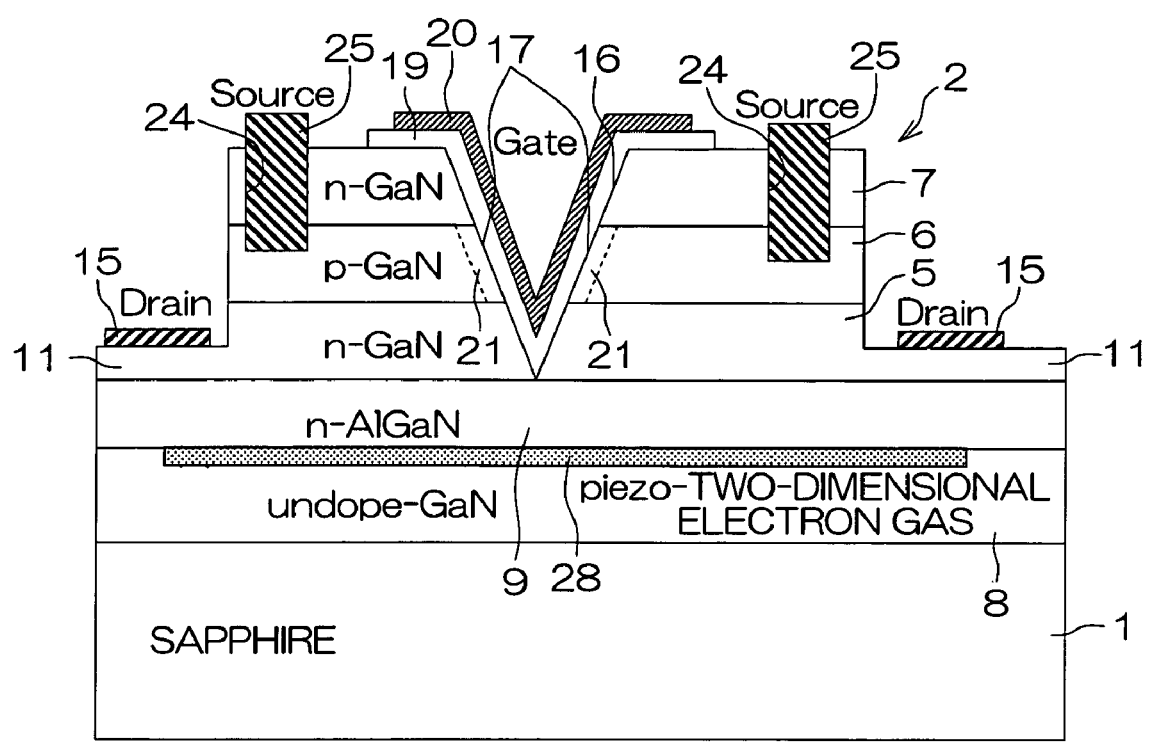
FIG. 3 A schematic sectional view for illustrating the structure of an MIS field-effect transistor according to a second embodiment of the present invention.

FIG. 3 is a schematic sectional view for illustrating the structure of an MIS field-effect transistor according to a second embodiment of the present invention. Referring to FIG. 3, reference numerals identical to those in the case of FIG. 1 are allocated to portions corresponding to the respective portions shown in the above FIG. 1. According to this embodiment, etching on both sides of a nitride semiconductor multilayer structure portion 2 is stopped in a layer-thickness intermediate portion of an N-type GaN layer 5. Thus, the N-type GaN layer 5 has drawn portions 11 drawn in the lateral direction of the nitride semiconductor multilayer structure portion 2 along the surface of a sapphire substrate 1. In other words, these drawn portions 11 are constituted of extensions of the N-type GaN layer 5. Drain electrodes 15 are formed in contact with the upper surfaces of these drawn portions 11.

Also according to this structure, an operation similar to that of the aforementioned first embodiment is enabled, and effects similar to those of the first embodiment can be attained. In order to manufacture the MIS field-effect transistor according to this embodiment, etching (FIG. 2B) for forming sectionally rectangular grooves 30 may be stopped in the layer-thickness intermediate portion of the N-type GaN layer 5 in the steps of FIGS. 2A to 2E.

In the case of the structure of this embodiment, an N-type AlGaN layer 9 may be omitted, and the N-type GaN layer 5 may be formed in contact with an intrinsic GaN layer 8.

Figure 4:
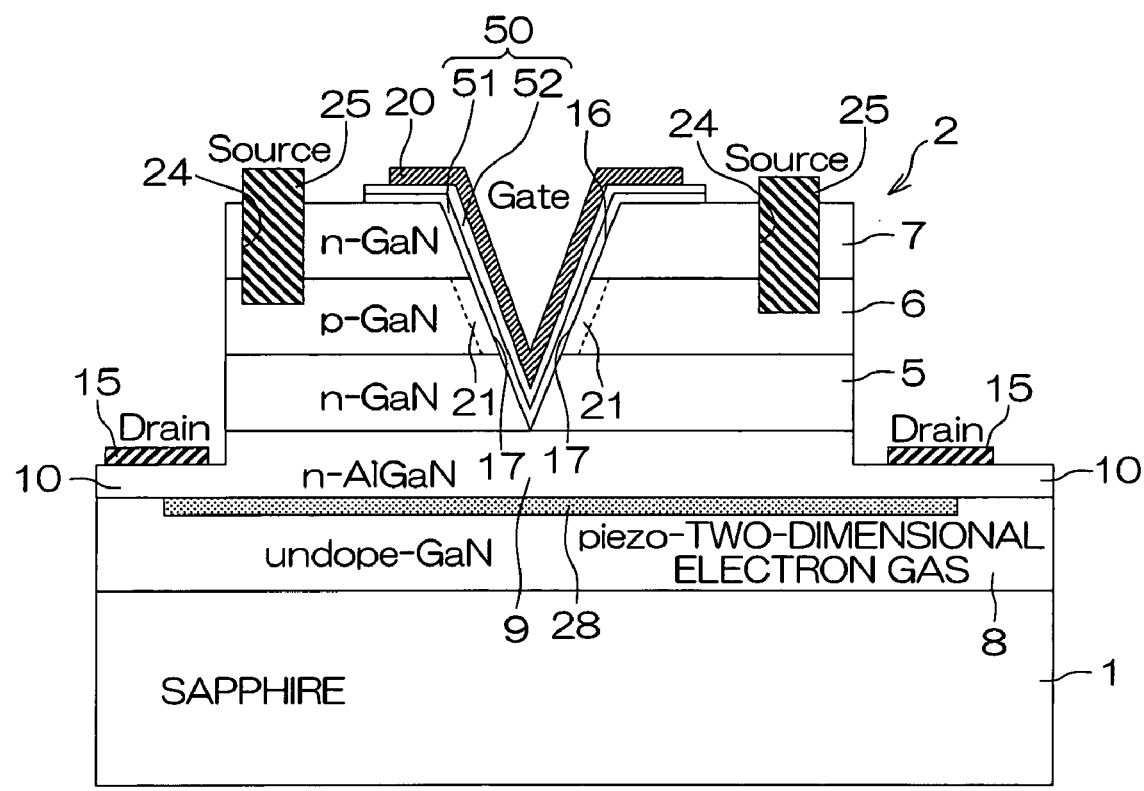
FIG. 4 A schematic sectional view for illustrating the structure of an MIS field-effect transistor according to a third embodiment of the present invention.

FIG. 4 is a schematic sectional view for illustrating the structure of an MIS field-effect transistor according to a third embodiment of the present invention. Referring to FIG. 4, reference numerals identical to those in the case of FIG. 1 are allocated to portions corresponding to the respective portions shown in the above FIG. 1. According to this embodiment, a gate insulating film 50 is formed by an AlGaN regrowth layer 51 regrown (epitaxially grown) from wall surfaces 17 of a trench 16 and an insulating film 52 stacked and formed on the surface of this AlGaN regrowth layer 51. This gate insulating film 50 is formed over a region covering the wall surfaces 17 of the trench 16 and reaching edge portions of the trench 16 on the upper surface of an N-type GaN layer 7, similarly to the gate insulating film 19 in the aforementioned embodiment.

The AlGaN regrowth layer 51 is epitaxially grown from the wall surfaces 17 which are GaN crystal surfaces after forming the trench 16 by dry etching and shaping the wall surfaces 17 by a wet etching treatment. The aluminum composition of this AlGaN regrowth layer 51 is set to not less than 50% and less than 10%. The AlGaN regrowth layer 51 preferably contains no In. Further, the wall surfaces 17 on which the AlGaN regrowth layer 51 is formed are preferably defined by nonpolar planes (m-planes (10-10) or a-planes (11-20)), or semipolar planes ((10-1-1), (10-1-3), (11-22) or the like), for example.

The insulating film 52 stacked on the AlGaN regrowth layer 51 can be prepared from a nitride or an oxide, for example. This insulating film 52 improves the insulating property of the gate insulating film 50 as a while, thereby contributing to suppression of a gate leakage current. If the insulating property of the AlGaN regrowth layer 51 is sufficient, the insulating film 52 may be omitted.

According to the structure of this embodiment, the interfaces between the gate insulating film 50 and the wall surfaces 17 are bonded surfaces between GaN crystals and an AlGaN crystal, and hence the same are stable interfaces, whereby the quantity of interfacial charge can be reduced. Thus, mobility in channel regions 21 can be improved and a leakage current can be suppressed, whereby the reliability of the device can be improved as a result.

Figure 5:
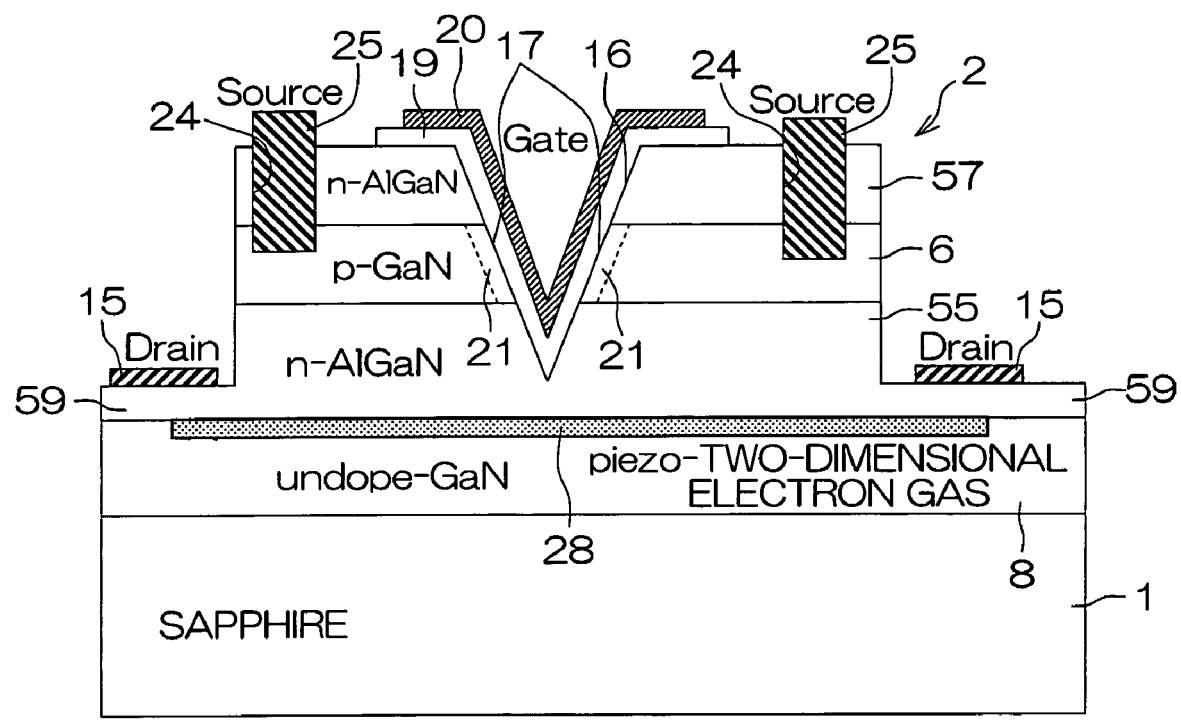
FIG. 5 A schematic sectional view for illustrating the structure of an MIS field-effect transistor according to a fourth embodiment of the present invention.

FIG. 5 is a schematic sectional view for illustrating the structure of an MIS field-effect transistor according to a fourth embodiment of the present invention. Referring to FIG. 5, reference numerals identical to those in the case of FIG. 1 are allocated to portions corresponding to the respective portions shown in the above FIG. 1. According to this embodiment, an N-type AlGaN layer 55 is applied in place of the N-type GaN layer 5 in the aforementioned embodiment, and an N-type AlGaN layer 57 is further employed in place of the N-type GaN layer 7. In addition, the N-type AlGaN layer 9 is omitted. In other words, the N-type AlGaN layer 55 is formed on the surface of an intrinsic GaN layer 8 by epitaxial growth, a P-type GaN layer 6 is further formed on the N-type AlGaN layer 55 similarly by epitaxial growth, and the N-type AlGaN layer 57 is formed on the surface of the P-type GaN layer 6 also by epitaxial growth.

Drawn portions 59 drawn in the lateral direction of a nitride semiconductor multilayer structure portion 2 are formed on the N-type AlGaN layer 55. Drain electrodes 15 are formed in contact with the upper surfaces of these drawn portions 59.

A trench 16 is formed in a depth reaching the N-type AlGaN layer 55 from the N-type AlGaN layer 57 through the P-type GaN layer 6, and formed in a sectionally V-shaped manner in this embodiment. A gate insulating film 19 and a gate electrode 20 are stacked/formed on wall surfaces 17 of this trench 16, similarly to the case of the aforementioned first embodiment.

Source electrode trenches 24 reaching the P-type GaN layer 6 from the N-type AlGaN layer 57 are formed on positions different from the trench 16. Source electrodes 25 are embedded in these source electrode trenches 24. Therefore, the source electrodes 25 are in contact with the N-type AlGaN layer 57 forming a source layer and also in contact with the P-type GaN layer 6, to fix the potential of this P-type GaN layer 6 equally to the potential of the N-type AlGaN layer 57 as the source layer.

Thus, a double heterostructure sandwiching the P-type GaN layer 6 with the N-type AlGaN layers 55 and 57 is formed. The band gaps of the AlGaN layers 55 and 57 are wider than the band gap of the GaN layer 6, whereby only the band gap of the P-type GaN layer 6 constituting channel regions 21 is small. Thus, the breakdown voltage of the device can be further improved.

This field-effect transistor can be prepared by a method similar to the method described with reference to FIGS. 2A to 2E. In other words, the N-type AlGaN layer 55 may be epitaxially grown on the surface of the intrinsic AlGaN layer 8, the P-type GaN layer 6 may be epitaxially grown thereon, and the N-type AlGaN layer 57 may be further epitaxially grown on the P-type GaN layer 6 in place of the N-type GaN layer 7. In a step (see FIG. 2B) of forming grooves 30 in order to shape the nitride semiconductor multilayer structure portion 2, the drawn portions 59 may be formed by stopping etching on a layer-thickness intermediate portion of the N-type AlGaN layer 55.

While the four embodiments of the present invention have been described, the present invention may be embodied in other ways. For example, the structure of the gate insulating film 50 shown in FIG. 4 can be replaced with the gate insulating film 19 according to the second embodiment (FIG. 3) and the fourth embodiment (FIG. 5). Further, the multilayer structure of the N-type AlGaN layer 55, the P-type GaN layer 6 and the N-type AlGaN layer 57 shown in the fourth embodiment (FIG. 5) can be employed also in the third embodiment (FIG. 4). While the N-type AlGaN layers 55 and 57 are arranged on both sides of the P-type GaN layer 6 in the fourth embodiment (FIG. 5), the breakdown voltage of the device can be improved also by forming only a layer stacked on one side of the P-type GaN layer 6 by an N-type AlGaN layer. In other words, the N-type GaN layer 5 may be applied without employing the N-type AlGaN layer 55, or the N-type GaN layer 7 may be applied without employing the N-type AlGaN layer 57 in the structure of FIG. 5.

Further, while such an example that the sectionally V-shaped trench 16 is formed on the nitride semiconductor multilayer structure portion 2 has been described in the aforementioned embodiments, the shape of the trench 16 may be another shape such as an inverted trapezoidal shape, a U-shape, a rectangular shape or a trapezoidal shape. In addition, the wall surfaces 17 may not be inclined surfaces inclined with respect to the substrate, and may not be planes either. In other words, the wall surfaces 17 may be planes perpendicular to the substrate, or may be curved surfaces.

While the gate insulating film 19 and the gate electrode 20 are stacked and formed on both of the pair of wall surfaces 17 of the trench 16 in the aforementioned embodiment, the multilayer structure of these may be formed only on one wall surface 17. Further, the nitride semiconductor multilayer structure portion 2 may be etched on a position shown by a two-dot chain line 60 in FIG. 1, so that the device is formed by employing only either side of this two-dot chain line 60, for example. In this case, it follows that the wall surfaces 17 extending over the N-type GaN layer 5, the P-type GaN layer 6 and the N-type GaN layer 7 are formed although no sectionally V-shaped trench is formed on the nitride semiconductor multilayer structure portion 2.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2006-228027 filed in the Japanese Patent Office on Aug. 24, 2006, the disclosure of which is incorporated herein by reference in its entirety.

The invention claimed is:

1. The MIS field-effect transistor comprising:
a substrate;
a nitride semiconductor multilayer structure portion formed on the substrate, the nitride semiconductor multilayer structure portion including a first group III-V nitride semiconductor layer of a first conductivity type, a second group III-V nitride semiconductor layer of a second conductivity type stacked on the first group III-V nitride semiconductor layer, a third group III-V nitride semiconductor layer of the first conductivity type stacked on the second group III-V nitride semiconductor layer, a fourth group III-V nitride semiconductor layer of the first conductivity type formed between the substrate and the first group III-V nitride semiconductor layer, and a fifth group III-V nitride semiconductor layer formed between the substrate and the fourth group III-V nitride semiconductor layer;
a gate insulating film formed on a wall surface formed over the first, second and third group III-V nitride semiconductor layers to extend over the first, second and third group III-V nitride semiconductor layers;
a gate electrode made of a conductive material formed as being opposed to the second group III-V nitride semiconductor layer with the gate insulating film interposed therebetween;
a drawn portion electrically connected to the first group III-V nitride semiconductor layer and drawn from the nitride semiconductor multilayer structure portion in a direction parallel to the substrate;
a drain electrode formed in contact with the drawn portion; and
a source electrode electrically connected to the third group III-V nitride semiconductor layer;
wherein the source electrode is provided as being in contact with both of the second group III-V nitride semiconductor layer and the third group III-V nitride semiconductor layer.

2. The MIS field-effect transistor according to claim 1, wherein
the fifth group III-V nitride semiconductor layer is an intrinsic semiconductor layer.

3. The MIS field-effect transistor according to claim 1, wherein
the fifth group III-V nitride semiconductor layer is a layer doped with Mg, C or Fe.

4. The MIS field-effect transistor according to claim 1, wherein
the drawn portion is an extension of the first group III-V nitride semiconductor layer.

5. The MIS field-effect transistor according to claim 1, wherein
the substrate is an insulating substrate.

6. The MIS field-effect transistor according to claim 1, wherein
a trench reaching the first group III-V nitride semiconductor layer is formed from the third group III-V nitride semiconductor layer through the second group III-V nitride semiconductor layer, and a sidewall of the trench forms the wall surface.

7. The MIS field-effect transistor according to claim 1, wherein the first, second and third group III-V nitride semiconductor layers are stacked with major surfaces defined by C-planes.

8. The MIS field-effect transistor according to claim 1, wherein the first, second and third group III-V nitride semiconductor layers are stacked with major surfaces defined by nonpolar planes or semipolar planes.

9. The MIS field-effect transistor according to claim 1, wherein the wall surface of the first, second and third group III-V nitride semiconductor layers on which the gate insulating film is formed is defined by a nonpolar plane or a semipolar plane.

10. The MIS field-effect transistor according to claim 1, wherein the substrate is a substrate having a region exhibiting a high dislocation density and a region exhibiting a small dislocation density in a direction along the substrate surface, and
the gate electrode is arranged to be opposed to a region grown from the region exhibiting a low dislocation density.

11. The MIS field-effect transistor according to claim 1, wherein the gate insulating film is a nitride or an oxide.

12. The MIS field-effect transistor according to claim 1, wherein the gate insulating film is made of silicon nitride or silicon oxide.

13. The MIS field-effect transistor according to claim 1, wherein the conductive material constituting the gate electrode is made of a simple metal or an alloy containing at least any one of Al, Au and Pt.

14. The MIS field-effect transistor according to claim 1, wherein the conductive material constituting the gate electrode contains polysilicon.

15. The MIS field-effect transistor according to claim 1, wherein the source electrode or the drain electrode is made of a material containing at least Al.

16. The MIS field-effect transistor according to claim 1, wherein the source electrode or the drain electrode is made of an alloy material containing at least Ti and Al.

17. The MIS field-effect transistor according to claim 1, wherein the material constituting the source electrode or the drain electrode contains Mo or an Mo compound, Ti or a Ti compound, or W or a W compound.

* * * * *